(12) United States Patent
Hsu et al.

(10) Patent No.: US 7,586,802 B2
(45) Date of Patent: Sep. 8, 2009

(54) MEMORY, BIT-LINE PRE-CHARGE CIRCUIT AND BIT-LINE PRE-CHARGE METHOD

(75) Inventors: Jer-Hau Hsu, Hsin-Chu (TW); Fu-Nian Liang, Hsin-Chu (TW); Yufe-Feng Lin, Hsin-Chu (TW)

(73) Assignee: Macronix International Co. Ltd., Hsin-Chu (TW)

( * ) Notice: Subject to any disclaimer, the term of this patent is extended or adjusted under 35 U.S.C. 154(b) by 1 day.

(21) Appl. No.: 12/027,333

(22) Filed: Feb. 7, 2008

(65) Prior Publication Data
US 2009/0201747 A1 Aug. 13, 2009

(51) Int. Cl.
*G11C 7/00* (2006.01)
(52) U.S. Cl. .................... 365/203; 365/185.21
(58) Field of Classification Search .......... 365/203, 365/185.25, 185.21
See application file for complete search history.

(56) References Cited
U.S. PATENT DOCUMENTS 5,671,186 A * 9/1997 Igura .................. 365/203
5,959,916 A * 9/1999 Kumar ................ 365/203
6,175,523 B1 * 1/2001 Yang et al. ........... 365/185.25
7,529,135 B2 * 5/2009 Pan et al. ............ 365/185.21

* cited by examiner

*Primary Examiner*—Anh Phung
(74) *Attorney, Agent, or Firm*—Volpe and Koenig, P.C.

(57) ABSTRACT

A memory is provided. The memory includes a memory cell, a clamp transistor, an inverter, a bit line, a pre-charge path and a detector and controller circuit. The memory is coupled to the clamp transistor. The clamp transistor has a first end, a second end and a control end. The inverter has an input end electrically connected to the second end of the clamp transistor and an output end electrically connected to the control end of the clamp transistor. The bit line is electrically connected to the second end of the clamp transistor and the input end of the inverter and has a bit-line voltage thereon. The pre-charge path is electrically connected to the first end of the clamp transistor through a node having a sensing voltage thereon. The detector and controller circuit is electrically connected to the first end of the clamp transistor and the pre-charge path for detecting the sensing voltage in order to open the pre-charge path to raise the bit-line voltage when the sensing voltage is at a low level and close the pre-charge path when the sensing voltage is at a high level.

17 Claims, 9 Drawing Sheets

MEMORY, BIT-LINE PRE-CHARGE CIRCUIT AND BIT-LINE PRE-CHARGE METHOD

FIELD OF THE INVENTION

The present invention relates to a memory, bit-line pre-charge circuit and bit-line pre-charge method, and more particularly to a memory, bit-line pre-charge circuit and bit-line pre-charge method for bit line voltage in a memory cell.

BACKGROUND OF THE INVENTION

Figure 1:
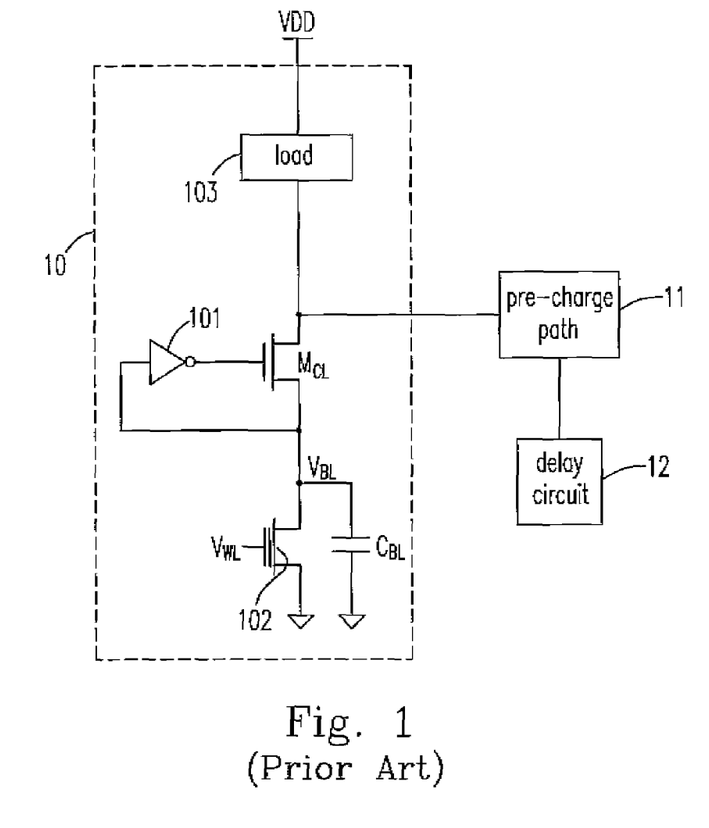
FIG. 1 is a circuit diagram showing a sensing conceptual scheme and precharge circuit in a conventional memory array according to the prior art.

Please refer to FIG. 1, which is a circuit diagram showing a sensing conceptual scheme and precharge circuit in a conventional memory array according to the prior art. In FIG. 1, the control circuit of only one cell of a plurality of cells in a memory array is illustrated.

In FIG. 1, the sensing conceptual scheme 10 mainly includes an inverter 101 and a memory cell 102. The clamp transistor MCL has a first end electrically connected to the voltage source VDD through the load 103, a second end electrically connected to the input end of the inverter 101 and the bit line, and a control end electrically connected to the output end of the inverter 101. The memory cell 102 is controlled by the word-line voltage $V_{WL}$. The capacitor $C_{BL}$ shown in the figure is only representative of a capacitor effect between the bit-line voltage $V_{BL}$ and the ground, which is not configured in the practical circuit topology as a real capacitor.

In the sensing conceptual scheme 10, the capacitance of the capacitor $C_{BL}$ is large since the bit line is long. For raising the bit-line voltage $V_{BL}$ to a predetermined value, e.g. 1.6 V, it will take a long time to stably raise the bit-line voltage $V_{BL}$ to the predetermined value only with the operation of the sensing conceptual scheme 10, which is a condition unable to satisfy the user.

To overcome this drawback, as shown in FIG. 1, an extra pre-charge path 11 is configured in the sensing conceptual scheme 10 in the prior art. The pre-charge is speeded up in the front end of the pre-charge phase by the extra pre-charge path 11 so as to raise the bit-line voltage $V_{BL}$ to the predetermined value more rapidly.

However, the operation of the extra pre-charge path 11 is controlled by the delay circuit 12 with a delay time which varies with power source, temperature and process corner. It is therefore difficult to control precisely the delay time of the delay circuit 12. That is to say, it is difficult to control precisely the start procedure, the operation procedure and the close procedure of the extra pre-charge path 11.

SUMMARY OF THE INVENTION

It is therefore an object of the present invention to provide a bit-line pre-charge circuit and bit-line pre-charge method to speed up the pre-charge of the bit line, close the extra pre-charge path early enough, and generate enough voltage margin to prevent the overcharge.

According to a first aspect of the present invention, a sensing conceptual scheme and precharge scheme of memory are provided. The sensing conceptual scheme of memory includes a clamp transistor, an inverter, a bit line, and a memory cell. The pre-charge scheme of memory includes a pre-charge path and a detector and controller circuit. The clamp transistor has a first end, a second end and a control end. The inverter has an input end electrically connected to the second end of the clamp transistor and an output end electrically connected to the control end of the clamp transistor. The bit line is electrically connected to the second end of the clamp transistor and the input end of the inverter and has a bit-line voltage thereon. The pre-charge path is electrically connected to the first end of the clamp transistor through a node having a sensing voltage thereon. The detector and controller circuit is electrically connected to the first end of the clamp transistor and the pre-charge path for detecting the sensing voltage in order to open the pre-charge path to raise the bit-line voltage when the sensing voltage is at a low level and close the pre-charge path when the sensing voltage is at a high level.

According to a second aspect of the present invention, a bit-line pre-charge circuit is provided. The bit-line pre-charge circuit includes a current source circuit and a detector and controller circuit. The current source circuit is electrically connected to the first end of the clamp transistor through a node having a sensing voltage thereon. The detector and controller circuit is electrically connected to the first end of the clamp transistor and the current source circuit for detecting the sensing voltage in order to enable the current source circuit to raise the bit-line voltage when the sensing voltage is at a first low level and disable the current source circuit when the sensing voltage is at a first high level.

According to a third aspect of the present invention, a bit-line pre-charge method is provided. The bit-line pre-charge method is for a plurality of bit-lines in a memory array, wherein each the bit-line is coupled to a clamp transistor. The clamp transistor has a first end, a second end and a control end, each the first end has a sensing voltage thereon, each the second end is electrically connected to the bit line, and the bit line has a bit-line voltage thereon. The bit-line pre-charge method includes steps of detecting the sensing voltage, pre-charging the clamp transistor to raise the bit-line voltage when the sensing voltage is at a low level, and stopping pre-charging the clamp transistor to when the sensing voltage is at a high level.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

To solve the above problems, the present invention provides a memory which includes an extra pre-charge path and a detector and controller circuit electrically connected thereto, besides the sensing conceptual scheme 10 including the clamp transistor MCL, the inverter 101 and the bit line.

Figure 2:
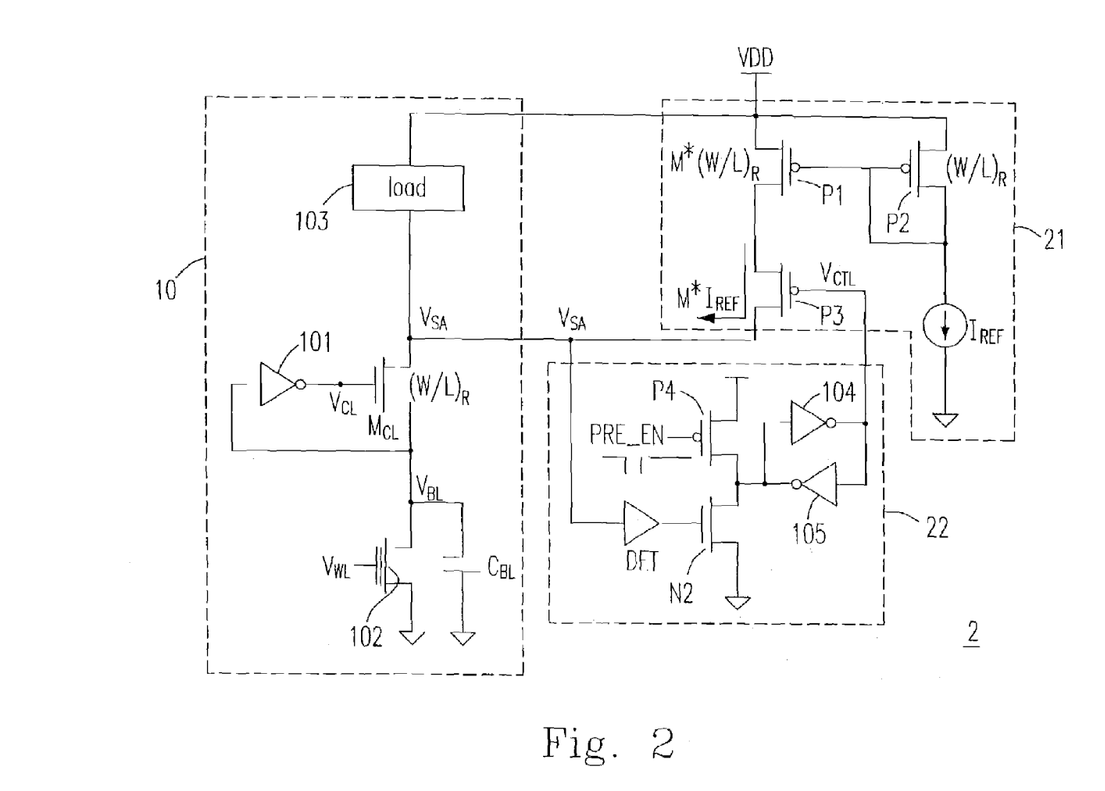
FIG. 2 is a circuit diagram showing, a memory according to a preferred embodiment of the present invention.

Please refer to FIG. 2, which is a circuit diagram showing a memory according to a preferred embodiment of the present invention. In FIG. 2, the circuit configuration of the sensing conceptual scheme 10 is as identical as that shown in FIG. 1. Besides the sensing conceptual scheme 10, the memory 2 further includes a pre-charge path 21 and a detector and controller circuit 22.

The operations among the sensing conceptual scheme 10, the pre-charge path 21 and the detector and controller circuit 22 are described as follows. The operations are conducted based on a sensing voltage Vsa on the drain of the NMOS transistor constituting the clamp transistor MCL and a bit-line voltage $V_{BL}$ on the bit line. The pre-charge path 21 and the detector and controller circuit 22 are electrically connected to the drain of the NMOS transistor constituting the clamp transistor MCL, so that the sensing voltage Vsa can be detected by the detector and controller circuit 22. When the sensing voltage Vsa is low, the detector and controller circuit 22 will open the pre-charge path 21 to raise the bit-line voltage $V_{BL}$. When the sensing voltage Vsa is high, the detector and controller circuit 22 will close the pre-charge path 21.

With the operations of the pre-charge path 21 and the detector and controller circuit 22, the pre-charge of the bit line can be speeded up rapidly and the pre-charge path 21 can be closed precisely as the sensing voltage Vsa approximates to the bit-line voltage $V_{BL}$. Therefore, the advantage is that the memory can be prevented from being overcharged and being influenced by power source, temperature and process margin.

In the embodiment shown in FIG. 2, the pre-charge path 21 is implemented with a current source circuit. As shown in FIG. 2, the current source circuit includes three PMOS transistors P1~P3 and a reference current source $I_{REF}$. The sources of the PMOS transistors P1 and the PMOS transistors P2 are electrically connected to the high voltage source VDD, and the gates thereof are electrically connected to each other. The drain of the PMOS transistors P2 is electrically connected to the gate thereof and the input end of the reference current source $I_{REF}$. The output end of the reference current source $I_{REF}$ is electrically connected to the low voltage source. The PMOS transistors P3 has a source electrically connected to the drain of the PMOS transistors P1, a gate receiving a control voltage Vctl from the detector and controller circuit 22, and a drain electrically connected to the drain of the NMOS transistor constituting the clamp transistor MCL.

It should be noticed that the aspect ratio of the PMOS transistors P1 is M times that of the PMOS transistors P2. The PMOS transistors P1, the PMOS transistors P2 and the reference current source $I_{REF}$ constitute a current mirror. Therefore, M times the reference current $I_{REF}$ is provided from the current source circuit to the clamp transistor MCL.

The detector and controller circuit 22 includes a PMOS transistor P4, a NMOS transistor N2, a buffer DET and two inverters 104 and 105. The PMOS transistor P4 has a source electrically connected to the high voltage source, and a gate controlled by an enable signal PRE_EN. The NMOS transistor N2 has a drain electrically connected to the drain of the PMOS transistor P4, a gate electrically connected to output end of the buffer DET, and a source electrically connected to the low voltage source. The inverters 104 and 105 are electrically connected to each other inversely. The input end of the buffer DET is electrically connected to the drain of the NMOS transistor constituting the clamp transistor MCL.

Figure 3:
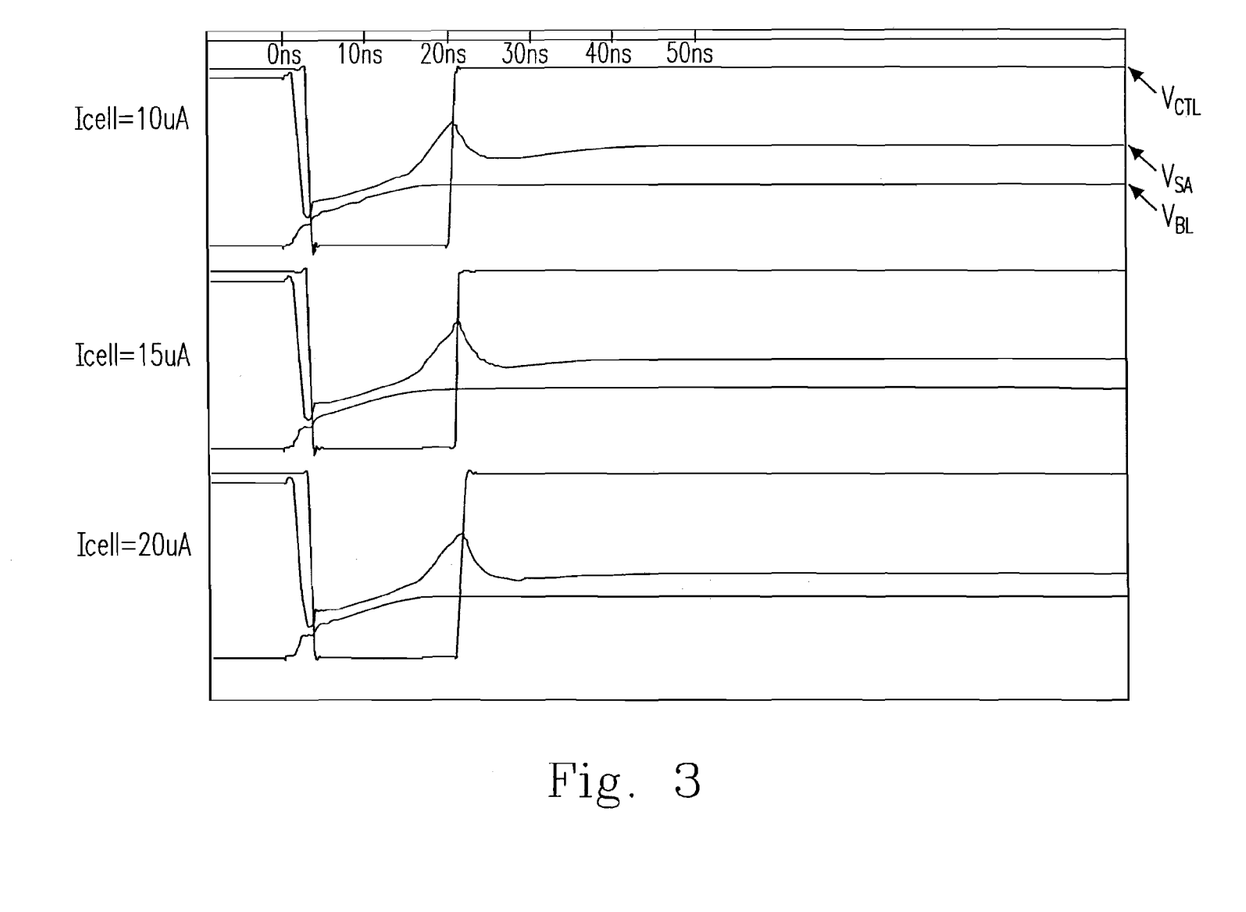
FIG. 3 is a waveform-time diagram showing the control voltage Vctl, the sensing voltage Vsa and the bit-line voltage $V_{BL}$ under different cell currents through the cell according to the present invention.

Please refer to FIG. 3, which is a waveform-time diagram showing the control voltage Vctl, the sensing voltage Vsa and the bit-line voltage $V_{BL}$ under different cell currents through the cell according to the present invention. The following description is made by referring to FIG. 2 wherein the cell current is 10 uA. As shown in the figure, the waveforms are similar when the cell currents are 15 uA and 20 uA.

1. 0 ns~20 ns

When the bit-line voltage $V_{BL}$ rises from a low level, the sensing voltage Vsa falls from a high level. After being transformed by the detector and controller circuit 22, the control voltage Vctl also falls to a low level. At this time, the PMOS transistor P3 of the pre-charge path 21 is turned on and then M times the reference current $I_{REF}$ is provided from the pre-charge path 21 to the clamp transistor MCL to speed up the pre-charge.

2. Around 0 ns

When the rise of the bit-line voltage $V_{BL}$ slows, the sensing voltage Vsa rises to a high level much more rapidly because of the amplification of the clamp transistor MCL. After being transformed by the detector and controller circuit 22, the control voltage Vctl also rises to a high level. At this time, the PMOS transistor P3 of the pre-charge path 21 is turned off and then M times the reference current $I_{REF}$ is stopped being provided from the pre-charge path 21 to the clamp transistor MCL.

3. 20 ns~50 ns

Theoretically, M times the reference current $I_{REF}$ should be greater than the cell current. Since the bit-line voltage $V_{BL}$ is not still high enough for sensing when the pre-charge path 21 being closed, the bit-line voltage $V_{BL}$ will take a long time to settle.

The formation of the settle time will be described based on FIG. 4 as follows. Please refer to FIG. 4, which is a diagram showing the M times the reference current $I_{REF}$ load line and the cell current Icell load line under the variation of the gate voltage $V_{CL}$ and the bit-line voltage $V_{BL}$ of the clamp transistor MCL according to the present invention.

Figure 4:
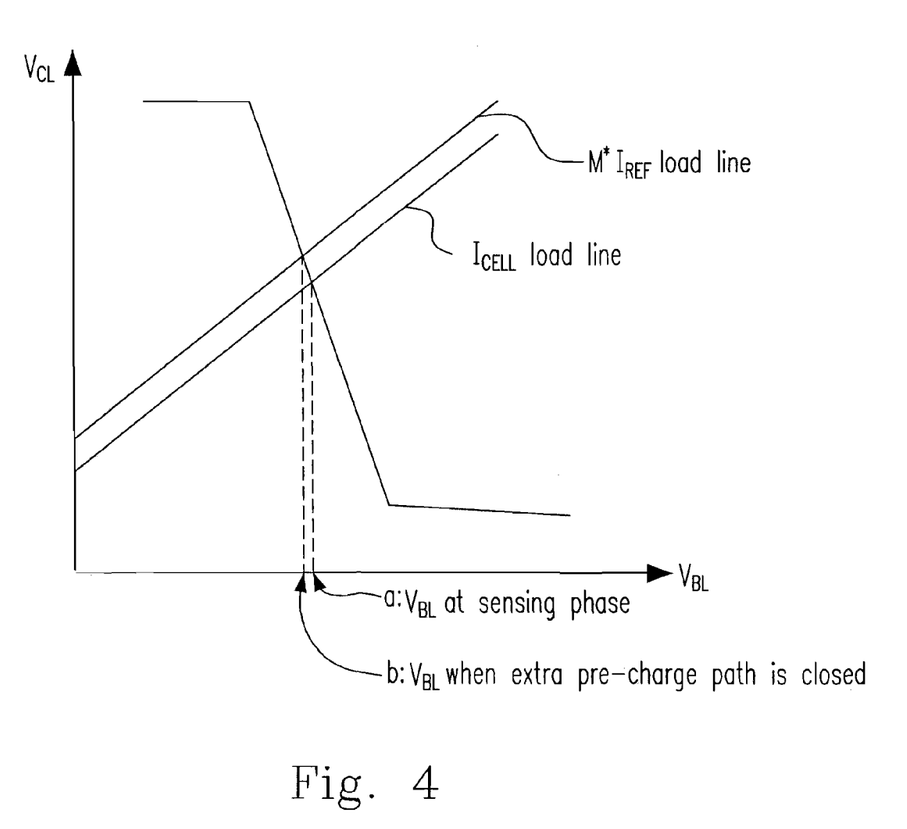
FIG. 4 is a diagram showing the M times the reference current $I_{REF}$ load line and the cell current Icell load line under the variation of the gate voltage $V_{CL}$ and the source voltage $V_{BL}$ of the clamp transistor MCL according to the present invention.

As shown in FIG. 4, for charging the bit line, M times the reference current $I_{REF}$ provided by the pre-charge path 21 should be greater than the cell current Icell. Moreover, the gate voltage $V_{CL}$ will fall when the bit-line voltage $V_{BL}$ rises since the gate/source voltage $V_{GS}$ of the clamp transistor MCL is constant. It is clear in FIG. 4 that point a represents the bit-line voltage $V_{BL}$ at the sensing phase and point b represents the bit-line voltage $V_{BL}$ when the pre-charge path 21 is closed. The voltage difference between point a and point b is the reason why the bit-line voltage $V_{BL}$ takes a long time to settle after the pre-charge path 21 is closed.

Different methods and circuit configurations are provided in the present invention to shorten the abovementioned settle time.

The first method is to increase the cell current Icell. That is, the cell current load line needs to be changed to be as close to the M times the reference current $I_{REF}$ load line as possible to make point a and point b be near to each other, so that the settle time can be shortened. For this purpose, the method adopted in the present invention is to increase the channel width of the clamp transistor MCL.

Figure 5:
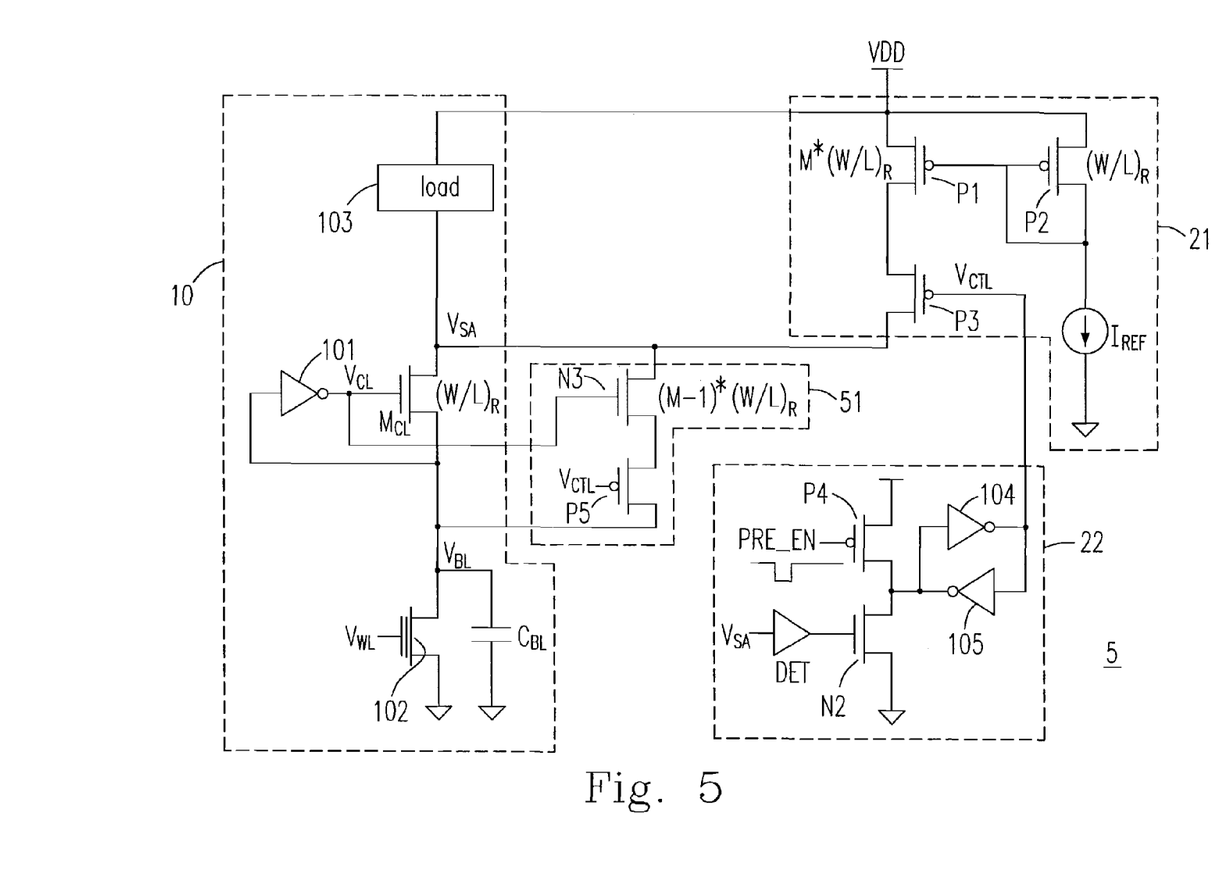
FIG. 5 is a circuit diagram showing a first compensation circuit of the memory according to the present invention.

Please refer to FIG. 5, which is a circuit diagram showing a first compensation circuit of the memory according to the present invention. Different from the memory 2 shown in FIG. 2, the memory 5 shown in FIG. 5 has an extra first compensation circuit 51 configured among the three ends of the NMOS transistor constituting the clamp transistor MCL so as to increase the channel width of the clamp transistor MCL and the cell current Icell.

The first compensation circuit 51 includes a NMOS transistor N3 and a PMOS transistor P5. The NMOS transistor N3 has a drain electrically connected to the drain of the clamp transistor MCL and a gate electrically connected to the gate of the clamp transistor MCL. The PMOS transistor P5 has a source electrically connected to the source of the NMOS transistor N3, a gate controlled by the control voltage Vctl, and a drain electrically connected to the source of the clamp transistor MCL. Moreover, the aspect ratio of the NMOS transistor N3 is M−1 times the aspect ratio of the clamp transistor MCL.

Figure 6:
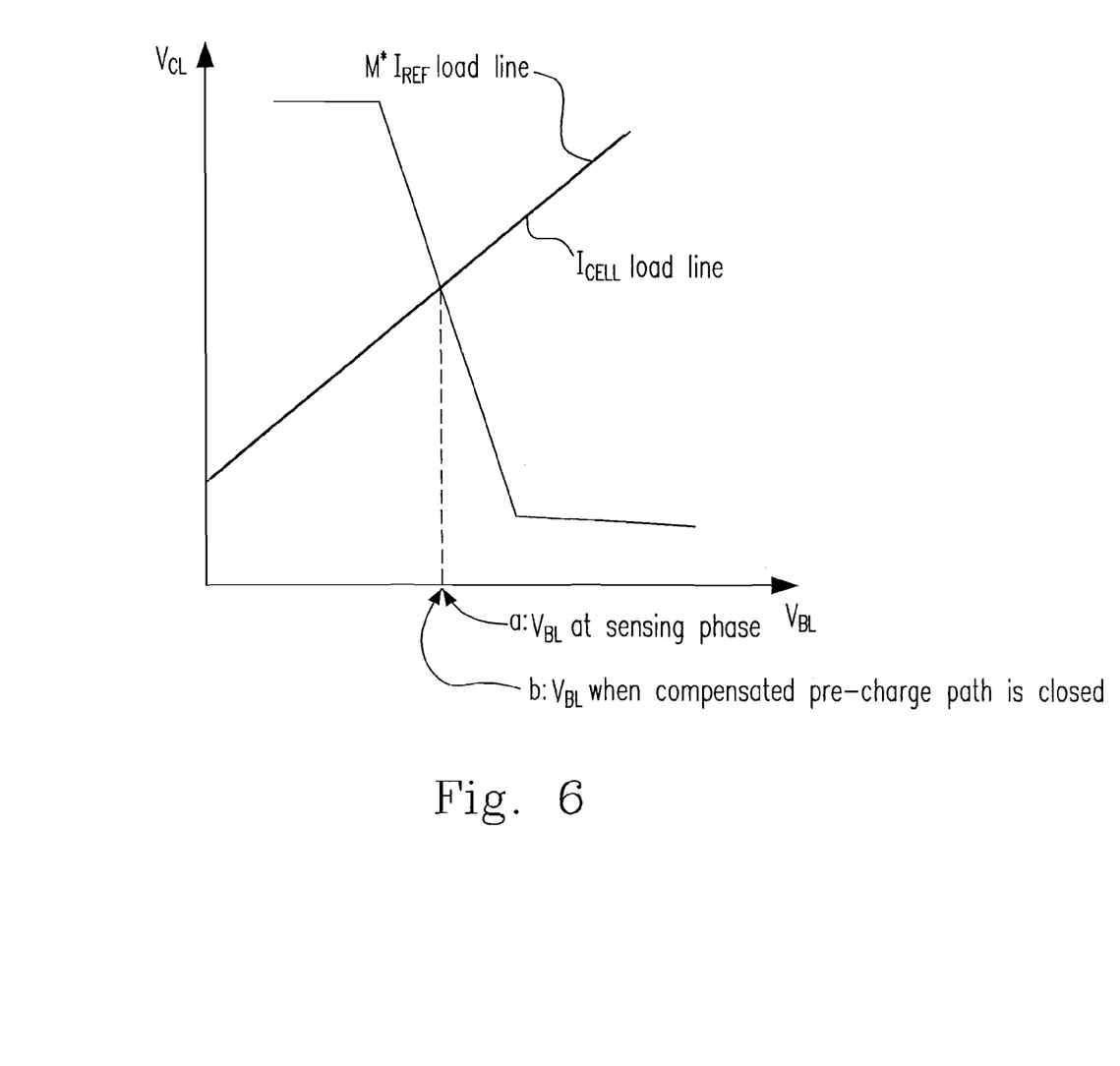
FIG. 6 is a diagram showing the compensated M times the reference current $I_{REF}$ load line and the cell current Icell load line under the variation of the gate voltage $V_{CL}$ and the bit-line voltage $V_{BL}$ of the clamp transistor MCL shown in FIG. 5 according to the present invention.

Please refer to FIG. 6, which is a diagram showing the compensated M times the reference current $I_{REF}$ load line and the cell current Icell load line under the variation of the gate voltage $V_{CL}$ and the bit-line voltage $V_{BL}$ of the clamp transistor MCL shown in FIG. 5 according to the present invention. As shown in FIG. 6, with the configuration of the first compensation circuit 51, the cell current Icell can be raised. Under some preferable condition, the cell current load line and the reference current $I_{REF}$ load line can be superposed to each other, so that point a and point b can also be superposed and the settle time can be eliminated.

The second method is to change the relationship between the bit-line voltage $V_{BL}$ and the gate voltage $V_{CL}$. That is, the slope of the variation line of the bit-line voltage $V_{BL}$ and the gate voltage $V_{CL}$ needs to be increased as steep as possible to make point a and point b be near to each other, so that the settle time can be shortened. For this purpose, the method adopted in the present invention is to enhance the driving ability of the first inverter 101 to shift the transfer function thereof.

Figure 7:
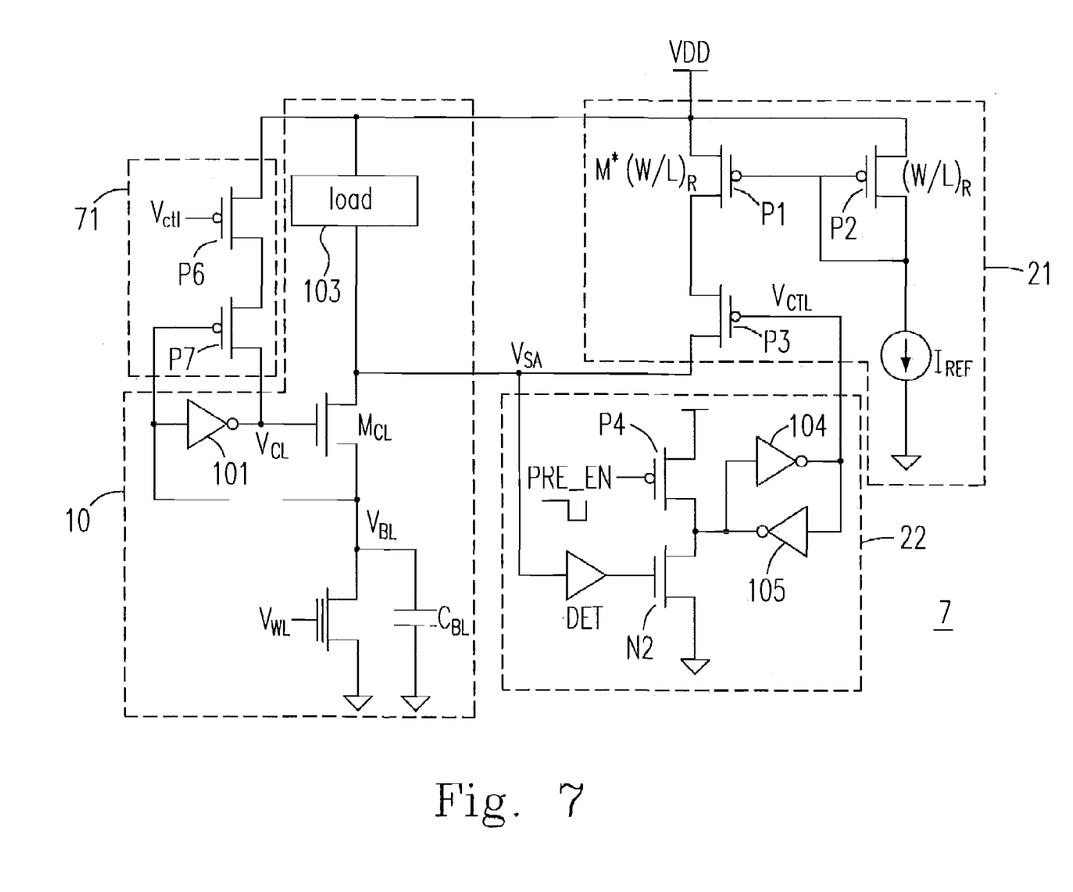
FIG. 7 is a circuit diagram showing a second compensation circuit of the memory according to the present invention.

Please refer to FIG. 7, which is a circuit diagram showing a second compensation circuit of the memory according to the present invention. Different from the memory 2 shown in FIG. 2, the memory 7 shown in FIG. 7 has an extra second compensation circuit 71 configured between the input end and the output end of the inverter 101 so as to enhance the driving ability of the first inverter 101 and to shift the transfer function thereof.

The second compensation circuit 71 includes a PMOS transistor P6 and a PMOS transistor P7. The PMOS transistor P6 has a drain electrically connected to the high voltage source VDD and a gate controlled by the control voltage Vctl. The PMOS transistor P7 has a source electrically connected to the drain of the PMOS transistor P6, a gate electrically connected to the input end of the first inverter 101, and a drain electrically connected to the output end of the first inverter 101.

Figure 8:
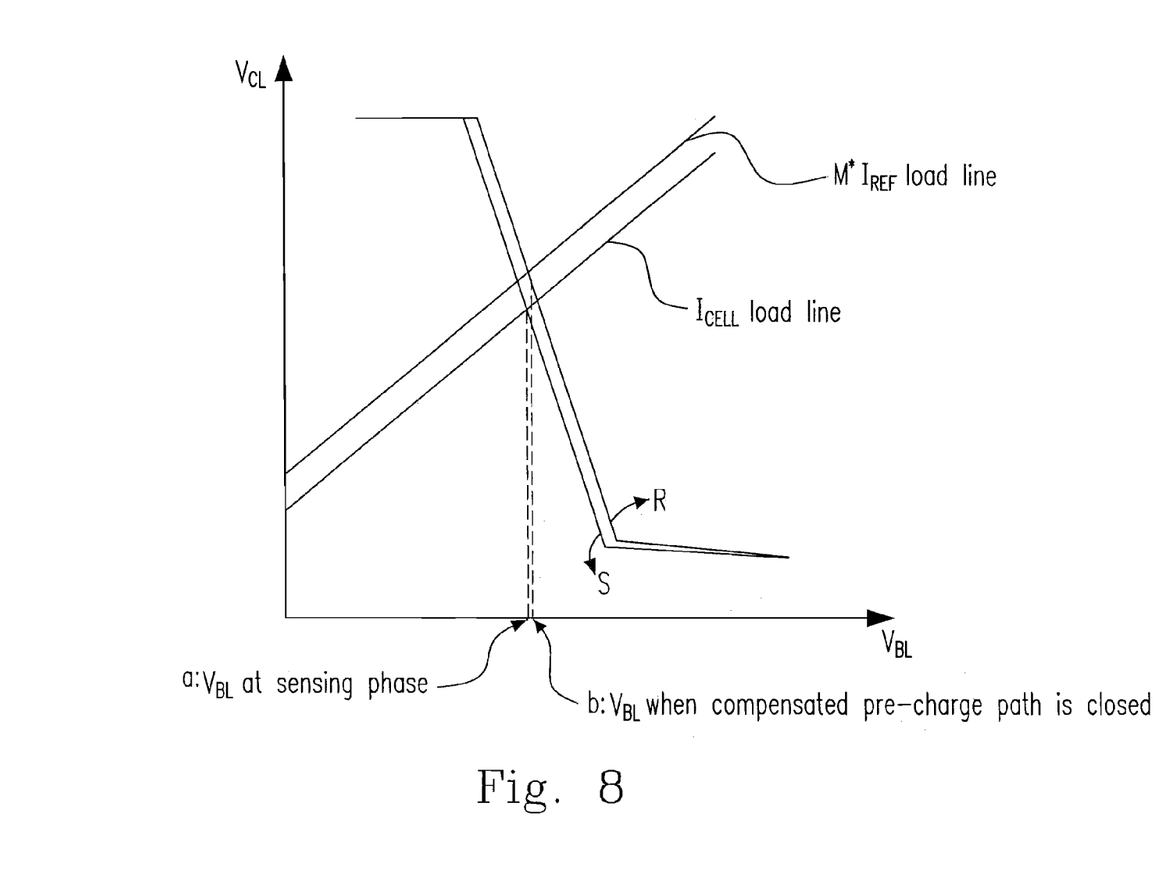
FIG. 8 is a diagram showing the compensated M times the reference current $I_{REF}$ load line and the cell current Icell load line under the variation of the gate voltage $V_{CL}$ and the bit-line voltage $V_{BL}$ of the clamp transistor MCL shown in FIG. 7 according to the present invention.

Please refer to FIG. 8, which is a diagram showing the compensated M times the reference current $I_{REF}$ load line and the cell current Icell load line under the variation of the gate voltage $V_{CL}$ and the bit-line voltage $V_{BL}$ of the clamp transistor MCL shown in FIG. 7 according to the present invention. As shown in FIG. 8, with the configuration of the second compensation circuit 71, the driving ability of the first inverter 101 can be enhanced and the transfer function thereof can be shifted. Under some preferable condition, the slope of the variation line of the bit-line voltage $V_{BL}$ and the gate voltage $V_{CL}$ can be steeper (as shown in the figure, the variation line S→ the variation line R), so that point a and point b can also be as near as possible to each other and the settle time can be eliminated.

Figure 9:
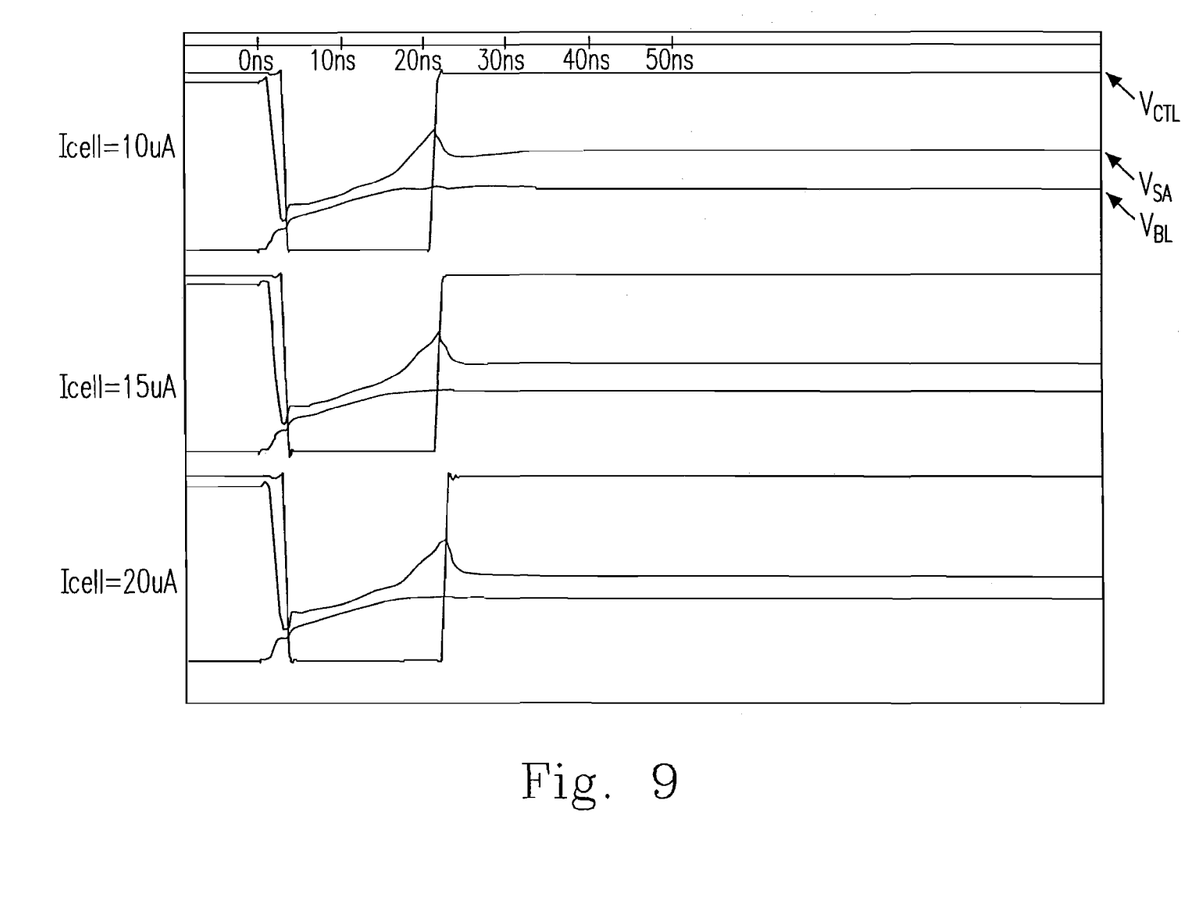
FIG. 9 is a waveform-time diagram showing the control voltage Vctl, the sensing voltage Vsa and the bit-line voltage $V_{BL}$ under different cell currents through the cell configured with the compensation circuit according to the present invention.

Please refer to FIG. 9, which is a waveform-time diagram showing the control voltage Vctl, the sensing voltage Vsa and the bit-line voltage $V_{BL}$ under different cell currents through the cell configured with the compensation circuit according to the present invention. After comparing FIG. 9 with FIG. 3, it is clear that the compensation method and the compensation circuit provided in the present invention can solve the problem of the bit-line voltage $V_{BL}$ in want of a long time to settle after the pre-charge path 21 is closed.

In conclusion, with the pre-charge path and the detector and controller circuit provided in the invention, the pre-charge of the cell can be speeded up in the front end of the pre-charge phase rapidly and stably and the overcharge can also be prevented. Besides, with the compensation method and the compensation circuit provided in the present invention, the problem of the bit-line voltage $V_{BL}$ in want of a long time to settle after the pre-charge path 21 is closed can be solved perfectly.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A memory, comprising:
   a memory cell;
   a clamp transistor having a first end, a second end and a control end, the second end being coupled to the memory cell;
   a first inverter having an input end electrically connected to the second end of the clamp transistor and an output end electrically connected to the control end of the clamp transistor;
   a bit line electrically connected to the second end of the clamp transistor and the input end of the first inverter and having a bit-line voltage thereon;
   a pre-charge path electrically connected to the first end of the clamp transistor through a node having a sensing voltage thereon; and
   a detector and controller circuit electrically connected to the first end of the clamp transistor and the pre-charge path for detecting the sensing voltage in order to open the pre-charge path to raise the bit-line voltage when the sensing voltage is at a first low level and close the pre-charge path when the sensing voltage is at a first high level.

2. The memory as claimed in claim 1, wherein the first end of the clamp transistor is electrically connected to a high voltage source through a load and the second end of the clamp transistor is electrically connected to a low voltage source through the memory cell.

3. The memory as claimed in claim 1, wherein the clamp transistor is a first NMOS transistor and the first end, the control end and the second end of the clamp transistor are a drain, a gate and a source of the first NMOS transistor respectively.

4. The memory as claimed in claim 1, wherein the pre-charge path is a current source circuit.

5. The memory as claimed in claim 4, wherein the current source circuit comprises:
  a first PMOS transistor having a source electrically connected to a high voltage source, a gate, a drain and a first aspect ratio;
  a second PMOS transistor having a source electrically connected to the high voltage source, a gate electrically connected to the gate of the first PMOS transistor, a drain electrically connected to the gate thereof, and a second aspect ratio which is 1/M times the first aspect ratio;
  a third PMOS transistor having a source electrically connected to the drain of the first PMOS transistor, a gate electrically connected to the detector and controller circuit and having a control voltage thereon, and a drain electrically connected to the first end of the clamp transistor; and
  a reference current source having an input end electrically connected to the drain of the second PMOS transistor and an output end electrically connected to a low voltage source for providing a reference current;
  wherein the third PMOS transistor is turned off to close the pre-charge path when the control voltage is at a second low level and the third PMOS transistor is turned on to open the pre-charge path for providing M times the reference current to the clamp transistor when the control voltage is at a second high level.

6. The memory as claimed in claim 5, wherein the detector and controller circuit comprises:
  a fourth PMOS transistor having a source electrically connected to a high voltage source, a gate controlled by a enable signal, and a drain;
  a second NMOS transistor having a drain electrically connected to the drain of the fourth PMOS transistor, a gate, and a source electrically connected to a low voltage source;
  a buffer having an input end electrically connected to the first end of the clamp transistor and an output end electrically connected to the gate of the second NMOS transistor;
  a second inverter having an input end electrically connected to the drain of the fourth PMOS transistor and the drain of the second NMOS transistor, and an output end electrically connected to the current source circuit; and
  a third inverter having an input end electrically connected to the current source circuit and the output end of the second inverter, and an output end electrically connected to the input end of the second inverter, the drain of the fourth PMOS transistor and the drain of the second NMOS transistor.

7. The memory as claimed in claim 6, wherein the memory is further electrically connected to a first compensation circuit for increasing a channel width of the clamp transistor so that a voltage between the control end and the second end of the clamp transistor is identical while the pre-charge path is open and closed.

8. The memory as claimed in claim 7, wherein the first compensation circuit comprises:
  a third NMOS transistor having a drain electrically connected to the first end of the clamp transistor, a gate electrically connected to the control end of the clamp transistor, a source, and a third aspect ratio; and
  a fifth PMOS transistor having a source electrically connected to the source of the third NMOS transistor, a gate controlled by the control voltage, and a drain electrically connected to the bit line;
  wherein the third aspect ratio is M−1 times an aspect ratio of the clamp transistor.

9. The memory as claimed in claim 6, wherein the memory is further electrically connected to a second compensation circuit for enhancing a driving ability of the first inverter and shifting a transfer function of the first inverter so that the bit-line voltage is identical while the pre-charge path is open and closed.

10. The memory as claimed in claim 9, wherein the second compensation circuit comprises:
  a sixth PMOS transistor having a source electrically connected to a high voltage source, a gate controlled by the control voltage, and a drain; and
  a seventh PMOS transistor having a source electrically connected to the drain of the sixth PMOS transistor, a gate electrically connected to the input end of the first inverter, and a drain electrically connected to the output end of the first inverter and the control end of the clamp transistor.

11. A bit-line pre-charge circuit, comprising:
  a clamp transistor having a first end, a second end and a control end;
  a bit line electrically connected to the second end of the clamp transistor and having a bit-line voltage thereon;
  a current source circuit electrically connected to the first end of the clamp transistor through a node having a sensing voltage thereon; and
  a detector and controller circuit electrically connected to the first end of the clamp transistor and the current source circuit for detecting the sensing voltage in order to enable the current source circuit to raise the bit-line voltage when the sensing voltage is at a first low level and disable the current source circuit when the sensing voltage is at a first high level.

12. The bit-line pre-charge circuit as claimed in claim 11, wherein the clamp transistor is a first NMOS transistor and the first end, the control end and the second end of the clamp transistor are a drain, a gate and a source of the first NMOS transistor respectively.

13. The bit-line pre-charge circuit as claimed in claim 11, wherein the current source circuit comprises:
  a first PMOS transistor having a source electrically connected to a high voltage source, a gate, a drain and a first aspect ratio;
  a second PMOS transistor having a source electrically connected to the high voltage source, a gate electrically connected to the gate of the first PMOS transistor, a drain electrically connected to the gate thereof, and a second aspect ratio which is 1/M times the first aspect ratio;
  a third PMOS transistor having a source electrically connected to the drain of the first PMOS transistor, a gate electrically connected to the detector and controller circuit and having a control voltage thereon, and a drain electrically connected to the first end of the clamp transistor; and
  a reference current source having an input end electrically connected to the drain of the second PMOS transistor and an output end electrically connected to a low voltage source for providing a reference current;

wherein the third PMOS transistor is turned off to disable the current source circuit when the control voltage is at a second low level and the third PMOS transistor is turned on to enable the current source circuit for providing M times the reference current to the clamp transistor when the control voltage is at a second high level.

14. The bit-line pre-charge circuit as claimed in claim 13, wherein the detector and controller circuit comprises:

a fourth PMOS transistor having a source electrically connected to a high voltage source, a gate controlled by a enable signal, and a drain;

a second NMOS transistor having a drain electrically connected to the drain of the fourth PMOS transistor, a gate, and a source electrically connected to a low voltage source;

a buffer having an input end electrically connected to the first end of the clamp transistor and an output end electrically connected to the gate of the second NMOS transistor;

a second inverter having an input end electrically connected to the drain of the fourth PMOS transistor and the drain of the second NMOS transistor, and an output end electrically connected to the current source circuit; and a third inverter having an input end electrically connected to the current source circuit and the output end of the second inverter, and an output end electrically connected to the input end of the second inverter, the drain of the fourth PMOS transistor and the drain of the second NMOS transistor.

15. A bit-line pre-charge method for a plurality of bit-lines in a memory array, each the bit-line coupled to a clamp transistor having a first end, a second end and a control end, each the first end having a sensing voltage thereon, each the second end electrically connected to the bit line, the bit line having a bit-line voltage thereon, the bit-line pre-charge method comprising steps of:

detecting the sensing voltage;

pre-charging the clamp transistor to raise the bit-line voltage when the sensing voltage is at a low level; and stopping pre-charging the clamp transistor when the sensing voltage is at a high level.

16. The bit-line pre-charge method as claimed in claim 15, further comprising a first compensation step of: increasing a channel width of the clamp transistor so that a voltage between the control end and the second end of the clamp transistor is identical while the clamp transistor is pre-charged and stopped pre-charging.

17. The bit-line pre-charge method as claimed in claim 15, further comprising a second compensation step of: configuring an inverter between the control end and the second end of the clamp transistor, and enhancing a driving ability of the inverter and shifting a transfer function of the inverter so that the bit-line voltage is identical while the clamp transistor is pre-charged and stopped pre-charging.

* * * * *